Figure 1:
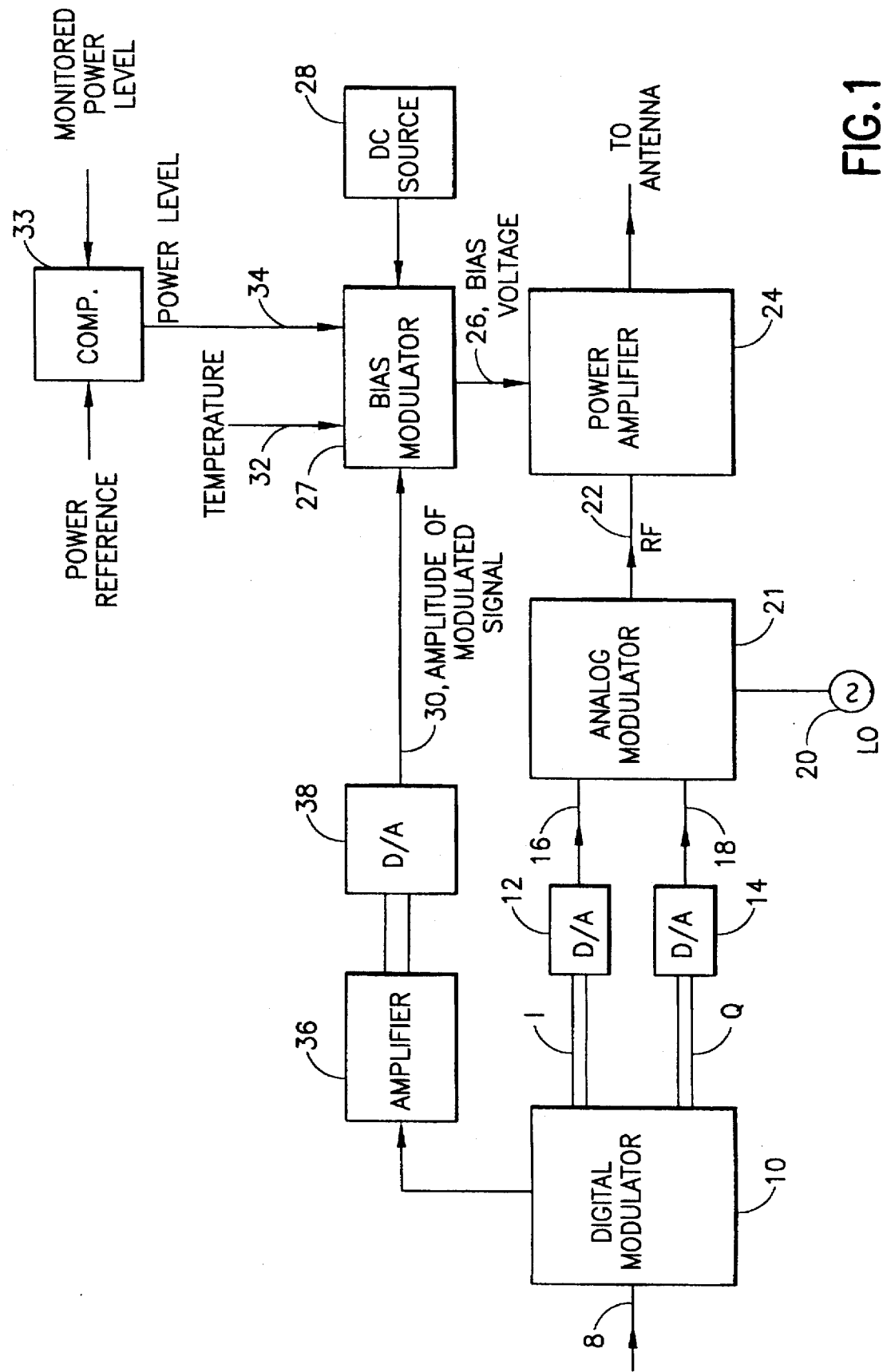

United States Patent [19]
Kumm et al.

[11] Patent Number: 5,745,526
[45] Date of Patent: Apr. 28, 1998

[54] RADIO TRANSMITTERS AND METHODS OF OPERATION

[75] Inventors: Arne Lennart Kumm, Basingstoke; Robert Jonathan Annett, Herfordshire, both of England

[73] Assignee: Nokia Mobile Phones Limited, Salo, Finland

[21] Appl. No.: 814,972

[22] Filed: Mar. 11, 1997

Related U.S. Application Data

[63] Continuation of Ser. No. 567,784, Dec. 5, 1995.

[30] Foreign Application Priority Data

Dec. 15, 1994 [GB] United Kingdom ............... 9425357

[51] Int. Cl.$^6$ ....................................... H04L 27/20
[52] U.S. Cl. ................. 375/297; 455/127; 330/127; 375/295
[58] Field of Search ........................ 375/297, 295; 455/127, 91; 330/127, 129

[56] References Cited

U.S. PATENT DOCUMENTS

| | | | |
|---|---|---|---|
| 3,900,823 | 8/1975 | Sokal et al. | 330/149 |
| 4,317,083 | 2/1982 | Boyd | 330/296 |
| 4,462,004 | 7/1984 | Cox et al. | 330/277 |
| 5,091,919 | 2/1992 | Kuisma | 375/60 |
| 5,109,538 | 4/1992 | Ikonen et al. | 455/89 |
| 5,121,081 | 6/1992 | Hori | 330/279 |
| 5,152,004 | 9/1992 | Vaisanen et al. | 455/68 |
| 5,164,884 | 11/1992 | Pesola | 361/386 |
| 5,214,372 | 5/1993 | Vaisanen et al. | 324/95 |
| 5,241,694 | 8/1993 | Vaisanen et al. | 455/126 |
| 5,247,542 | 9/1993 | Onodera et al. | 375/297 |
| 5,251,330 | 10/1993 | Chiba et al. | 455/91 |
| 5,276,917 | 1/1994 | Vanhanen et al. | 455/89 |
| 5,291,150 | 3/1994 | Saarnimo et al. | 330/279 |
| 5,392,463 | 2/1995 | Yamada | 455/93 |
| 5,392,464 | 2/1995 | Pakonen | 455/115 |
| 5,432,473 | 7/1995 | Mattila et al. | 330/133 |
| 5,434,537 | 7/1995 | Kukkonen | 330/2 |
| 5,507,016 | 4/1996 | Okuhara | 455/127 |
| 5,530,923 | 6/1996 | Heinonen et al. | 455/126 |
| 5,625,322 | 4/1997 | Gourgue et al. | 330/129 |

FOREIGN PATENT DOCUMENTS

| | | |
|---|---|---|
| 0431201 | 6/1991 | European Pat. Off. . |
| 2117591 | 10/1983 | United Kingdom . |
| WO 91/00653 | 1/1991 | WIPO . |

*Primary Examiner*—Stephen Chin
*Assistant Examiner*—Betsy L. Deppe
*Attorney, Agent, or Firm*—Perman & Green, LLP

[57] ABSTRACT

A radio transmitter has a digital modulator 10 which modulates an incoming coded signal according to π/4 DQPSK modulation. A signal 30 representative of the amplitude of the modulated signal is applied to a bias modulator 27 to modulate the magnitude of a bias voltage 26. The modulated bias voltage 26 is applied to a power amplifier 24 of the transmitter in order to improve the apparent linearity and adjacent channel performance of the power amplifier.

8 Claims, 1 Drawing Sheet

1

RADIO TRANSMITTERS AND METHODS OF OPERATION

This application is a continuation of copending application Ser. No. 08/567,784 filed on Dec. 5, 1995.

FIELD OF INVENTION

This invention relates to radio transmitters and to methods of operation of such transmitters.

BACKGROUND OF INVENTION

Radio transmitters have power amplifiers which typically have a generally linear relationship between input power and output power, up to a certain power level at which linearity is lost. The point at which the curve of output power as ordinate plotted against input power as abscissa begins to depart from linearity and to flatten off is called the compression point. It is desirable for the power amplifier to operate as close as possible to the compression point because this represents the highest power level at which small variations in input power produce linear variations in output power. The invention aims to provide a radio transmitter having a power amplifier biased in such a manner that, in effect, the operating point is varied to maintain linearity with variations in power of the modulated signal to be transmitted.

SUMMARY OF INVENTION

According to one aspect of the invention a radio transmitter comprises a power amplifier for amplifying a modulated radio frequency signal and a voltage source for providing a bias voltage for the power amplifier, characterised by means for deriving from the modulated signal a signal representative of the amplitude of the modulated signal and means for modifying the bias voltage in accordance with said amplitude to produce a modified bias voltage which is applied to the power amplifier.

According to another aspect of the invention there is provided a method of operating a radio transmitter including a power amplifier for amplifying a modulated radio frequency signal, the method comprising deriving from the modulated signal a signal representative of the amplitude of the modulated signal, modifying a bias voltage in accordance with said amplitude and thereby producing a modified bias voltage and applying the modified bias voltage to the power amplifier.

Preferably, the modulated signal is modulated by phase shift keying, which may be $\pi/4$ DQPSK (Differential Quaternary Phase Shift Keying), but may be any modulation scheme where information is transmitted in the amplitude of the signal.

DESCRIPTION OF AN EMBODIMENT OF THE INVENTION

A radio transmitter according to the invention will now be described, by way of example, with reference to the accompanying drawing, the single figure of which is a block circuit diagram of a transmitter operable in accordance with the present invention.

Referring to the drawing, the signal to be transmitted is in the form of coded digital bits 8 which are fed to a digital modulator 10. The modulator 10 modulates the bits according to a modulation process called $\pi/4$ DQPSK (Differential Quaternary Phase Shift Keying). The qualification $\pi/4$ refers to the fact that the signals are rotated by $\pi/4$ (45°) to avoid the problem of the signal having zero amplitude from time to time. Each pair of bits are coded according to the following phase relationships:

| Bit Pair | $\Delta$ Phase |
|---|---|
| 00 | $\pi/4$ |
| 01 | $3\pi/4$ |
| 10 | $-\pi/4$ |
| 11 | $-3\pi/4$ |

The signals emerging from the modulator 10 are the I and Q signals which carry the modulation information and which are in-phase quadrature. The I and Q signals are fed to respective digital to analogue converters 12, 14 which produce corresponding analogue signals on connections 16, 18. The latter are used to modulate local oscillator 20 using an analogue modulator 21 which acts to combine the signals into a radio frequency signal, on a lead 22, which is fed to a power amplifier 24 of the transmitter. The output of the power amplifier 24 is a radio frequency signal which is transmitted from an antenna of the transmitter.

A bias voltage 26 is applied to the power amplifier 24. This bias voltage is derived primarily from a D.C. source 28 but the magnitude of the constant voltage from the source 28 is modified or modulated in a bias modulator 27 in accordance with three variables:

- a signal 30 representative of the amplitude of the modulated signal from the modulator 10
- a signal 32 compensating for temperature changes
- a signal 34 causing the power amplifier to have an output at a predetermined power level, or within a predetermined range of power levels.

The signal 30 is an important modifying influence and is derived from the modulator 10 through an amplifier 36 and a digital to analogue converter 38. The amplifier 36 derives the magnitude of the amplitude of the modulated signal by computing the square root of the sum of the squares of the I and Q signals, or by approximating the amplitude, e.g. by computing 0.99 I plus 0.33 Q. In effect, the signal 30 is added to the D.C. bias voltage from the source 28 so as continuously modify the bias voltage 26 in dependence on the instantaneous peak output power of the modulated signal, without degrading efficiency. This improves the apparent linearity of the power amplifier and enhances adjacent channel performance, giving the possibility of relaxing the power amplifier specification and ultimately reducing the cost of the power amplifier and reducing current consumption.

The signal 32 is representative of ambient temperature and its application to the bias modulator 27 provides compensation for temperature-related effects, such as temperature drift in the performance of the power amplifier.

The signal 34 is representative of a desired output power level of the power amplifier 24. The signal 34 is conveniently derived by monitoring the actual output power level from the amplifier 24, comparing this with a desired power level in a comparator 33 to give an error signal and deriving from the error signal such as by filtering, the signal 34 which, by influencing the signal 26, completes the feedback control loop.

Generally, the efficiency of linear power amplifiers is very much dependent on the bias level applied to the power amplifier:

(a) a high bias level gives good linearity, but quite poor efficiency, (b) a low bias level gives poor linearity, but good efficiency.

The signal 34 applies a high bias at high power levels where good linearity matters, and low bias at low power levels where good linearity is less important. The bias for low power levels must be set in such a way that the linearity requirement is correct for the power level. The main benefit is an increased power amplifier efficiency and current saving, particularly the lower power levels.

What we claim is:

1. A radio transmitter comprising:

a first modulator having an input coupled to a digital signal and a plurality of outputs for outputting in-phase (I) and quadrature (Q) signals corresponding to said digital input signal;

a second modulator having first inputs coupled to said outputs of said first modulator and a second input coupled to an output of a radio frequency oscillator for generating a radio frequency carrier signal that is modulated in accordance with said in-phase (I) and quadrature (Q) signals;

a linear power amplifier having an input coupled to an output of said second modulator for amplifying said modulated radio frequency carrier signal; a voltage source for providing a bias voltage for the linear power amplifier;

means, having an input coupled to an output of said first modulator, for deriving an amplitude signal as a mathematical function of a magnitude of the amplitudes of said in-Phase (I) and quadrature (Q) signals;

a feedback circuit having a first input coupled to an output of said linear power amplifier for detecting an actual power level of said output, a second input coupled to a desired power level reference signal, and an output providing an error signal expressive of a difference between the actual power level and the desired power level reference signal; and means for modifying the bias voltage in accordance with a combination of said amplitude signal and said error signal to produce a modified bias voltage which is applied to the linear power amplifier for varying the operating point of said linear power amplifier to maintain linear operation despite variations in said amplitude signal.

2. A radio transmitter according to claim 1, wherein the means for modifying the bias voltage comprises a bias modulator in which the amplitude signal is added to the bias voltage from the voltage source.

3. A radio transmitter according to claim 1, wherein said in-phase (I) and quadrature (Q) signals correspond to a π/4 Differential Quaternary Phase Shift Keying (DOPSK) modulated signal.

4. A radio transmitter according to claim 1, wherein said mathematical function of the magnitude of the amplitudes of said in-phase (I) and quadrature (Q) signals is one of: (a) a square root of the sum of the squares of said in-phase (I) and quadrature (Q) signals; or (b) an approximation obtained by multiplying the magnitude of said in-phase (I) signal by a first constant and multiplying the magnitude of said quadrature (Q) signal by a second constant and adding the results.

5. A method for operating a radio transmitter comprising the steps of:

operating a first modulator to output in-phase (I) and quadrature (Q) signals corresponding to a digital input signal;

operating a second modulator to generate a radio frequency carrier signal that is modulated in accordance with the in-phase (I) and quadrature (Q) signals; and amplifying the modulated radio frequency carrier signal with a linear power amplifier prior to outputting the modulated radio frequency carrier signal to an antenna, the step of amplifying including the following steps of, (a) biasing the linear power amplifier with a bias voltage from a bias voltage source;

(b) deriving an amplitude signal as a mathematical function of a magnitude of the amplitudes of the in-phase (I) and quadrature (Q) signals;

(c) generating an error signal that is expressive of a difference between an actual transmitter output power level and a desired transmitter output power level; and (d) modifying the bias voltage in accordance with a combination of the amplitude signal and the error signal to produce a modified bias voltage which is applied to the linear power amplifier for varying the operating point of the linear power amplifier to maintain linear operation despite variations in the amplitude signal.

6. A method according to claim 5, wherein the step of modifying includes a step of adding the amplitude signal to the bias voltage from the bias voltage source.

7. A method according to claim 5, wherein the in-phase (I) and quadrature (Q) signals correspond to a π/4 Differential Quaternary Phase Shift Keying (DQPSK) modulated signal.

8. A method according to claim 5, wherein the mathematical function of the magnitude of the amplitudes of said in-phase (I) and quadrature (Q) signals is one of: a (a) square root of the sum of the squares of said in-phase (I) and quadrature (Q) signals; or (b) an approximation obtained by multiplying the magnitude of said in-phase (I) signal by a first constant, multiplying the magnitude of said quadrature (Q) signal by a second constant, and adding the results.

* * * * *